US012677583B2

(12) United States Patent
    Wang

(10) Patent No.: US 12,677,583 B2
(45) Date of Patent: Jul. 7, 2026

(54) DISPLAY PANEL AND METHOD FOR REPAIRING SAME

(71) Applicant: Shenzhen China Star Optoelectronics Semiconductor Display Technology Co., Ltd., Shenzhen (CN)

(72) Inventor: Ruonan Wang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 44 days.

(21) Appl. No.: 17/638,243

(22) PCT Filed: Jan. 20, 2022

(86) PCT No.: PCT/CN2022/072871
    § 371 (c)(1),
    (2) Date: Feb. 25, 2022

(87) PCT Pub. No.: WO2023/133912
    PCT Pub. Date: Jul. 20, 2023

(65) Prior Publication Data
    US 2024/0057466 A1    Feb. 15, 2024

(30) Foreign Application Priority Data
    Jan. 12, 2022    (CN) .......................... 202210031444.6

(51) Int. Cl.
    *H10K 59/121*    (2023.01)
    *H10K 59/122*    (2023.01)
    *H10K 71/00*    (2023.01)
(52) U.S. Cl.
    CPC ....... *H10K 71/861* (2023.02); *H10K 59/1213* (2023.02); *H10K 59/122* (2023.02)

(58) Field of Classification Search
    CPC . H10K 71/861; H10K 59/122; H10K 59/1213
    See application file for complete search history.

(56) References Cited

U.S. PATENT DOCUMENTS

2010/0207106 A1    8/2010  Lhee
2011/0109299 A1*   5/2011  Chaji ................... G09G 3/3283
                                                    324/76.11
(Continued)

FOREIGN PATENT DOCUMENTS

CN    102437112 A    5/2012
CN    102654661 A    9/2012
(Continued)

OTHER PUBLICATIONS

International Search Report in International application No. PCT/CN2022/072871,mailed on Jun. 6, 2022.
(Continued)

*Primary Examiner* — Joshua Benitez Rosario
*Assistant Examiner* — Christopher A Culbert
(74) *Attorney, Agent, or Firm* — Nathan & Associates Patent Agents Ltd.; Menachem Nathan

(57) ABSTRACT

A display panel and a method for repairing the same are provided. Each sub-pixel of the display panel includes a substrate, an active layer, a source electrode, a drain electrode, an anode electrode, a cathode electrode, a first repair electrode, and a second repair electrode. The first repair electrode is disposed between the active layer and the anode electrode and is connected to the source electrode. The second repair electrode is disposed between the first repair electrode and the cathode electrode and is connected to the cathode electrode. An orthographic projection of the second repair electrode on the substrate at least partially overlaps with an orthographic projection of the first repair electrode on the substrate.

19 Claims, 5 Drawing Sheets

(56) References Cited

U.S. PATENT DOCUMENTS

2020/0161397 A1      5/2020  Pang
2021/0384481 A1*   12/2021  Sun ..................... H10K 59/131

FOREIGN PATENT DOCUMENTS

CN          104064584  A      9/2014
CN          106226966  A     12/2016
CN          207134356  U      3/2018
CN          108258007  A      7/2018
CN          110459578  A     11/2019
JP         2007121424  A      5/2007

OTHER PUBLICATIONS

Written Opinion of the International Search Authority in International application No. PCT/CN2022/072871, mailed on Jun. 6, 2022.
Chinese Office Action issued in corresponding Chinese Patent Application No. 202210031444.6 dated Nov. 30, 2022, pp. 1-9.

* cited by examiner

DISPLAY PANEL AND METHOD FOR REPAIRING SAME

FIELD OF INVENTION

The present disclosure relates to the technical field of display, and particularly to a display panel and a method for repairing the same.

BACKGROUND

In a production of an organic light-emitting diode (OLED) display panel, due to an influence of a production process or an external environment, there will be some residues such as metal chips or foreign objects in thin-film transistors.

The residues such as metal chips or foreign objects in the thin-film transistors will make sub-pixels driven by the thin-film transistors become bright spot sub-pixels, and the bright spot sub-pixels will greatly reduce a quality of the display panel.

SUMMARY OF DISCLOSURE

The present disclosure provides a display panel and a method for repairing the same, which can repair a bright spot sub-pixel when the bright spot sub-pixel appears, so as to improve a quality of the display panel.

The present disclosure provides a display panel comprising a plurality of sub-pixels. Each of the sub-pixels comprises:

a substrate;

an active layer disposed on a side of the substrate;

a source electrode and a drain electrode disposed on a side of the active layer away from the substrate;

an anode electrode disposed on a side of the source electrode away from the active layer and connected to the source electrode;

a first repair electrode disposed between the active layer and the anode electrode, located on a side of the source electrode away from the drain electrode, and connected to the source electrode;

a cathode electrode disposed on a side of the anode electrode away from the source electrode; and a second repair electrode disposed between the first repair electrode and the cathode electrode and connected to the cathode electrode, wherein an orthographic projection of the second repair electrode on the substrate at least partially overlaps with an orthographic projection of the first repair electrode on the substrate, and the second repair electrode is insulated from the first repair electrode.

In some embodiment, the first repair electrode is disposed in a same layer as the source electrode, and extends from an end of the source electrode to a direction away from the drain electrode.

In some embodiment, the second repair electrode is disposed in a same layer as the anode electrode. Each of the sub-pixels further comprises a pixel definition layer. The pixel definition layer is disposed between the anode electrode and the cathode electrode and is provided with a connection hole. The cathode electrode is connected to the second repair electrode through the connection hole.

In some embodiment, each of the sub-pixels further comprises a planarization layer. The planarization layer is disposed between the source electrode and the anode electrode and is provided with a first via hole, and the anode electrode is connected to the source electrode through the first via hole. The connection hole exposes the second repair electrode, and the cathode electrode extends into the connection hole and is connected to the second repair electrode.

In some embodiment, each of the sub-pixels further comprises a passivation layer, a protective electrode, and a planarization layer which are sequentially disposed between the source electrode and the anode electrode. The passivation layer is provided with a contact hole, and the protective electrode is connected to the source electrode through the contact hole. The planarization layer is provided with a first via hole and a second via hole. The first via hole communicates with the contact hole. The anode electrode is connected to the protective electrode through the first via hole. The second via hole communicates with the connection hole. The second repair electrode extends into the second via hole. The cathode electrode extends from the connection hole into the second via hole and is connected to the second repair electrode.

In some embodiment, each of the sub-pixels further comprises an auxiliary repair electrode. The auxiliary repair electrode is disposed in a same layer as the protective electrode. The second via hole exposes the auxiliary repair electrode. The second repair electrode extends into the second via hole and is connected to the auxiliary repair electrode.

In some embodiment, each of the sub-pixels further comprises a passivation layer, a protective electrode, a planarization layer, and a pixel definition layer which are sequentially disposed between the source electrode and the anode electrode. The passivation layer is provided with a contact hole. The protective electrode is connected to the source electrode through the contact hole. The second repair electrode is disposed in a same layer as the protective electrode. The planarization layer is provided with a first via hole and a second via hole. The first via hole communicates with the contact hole. The anode electrode is connected to the protective electrode through the first via hole. The second via hole exposes the second repair electrode. The pixel definition layer is provided with a connection hole communicating with the second via hole. The connection hole exposes the second repair electrode. The cathode electrode extends into the connection hole and is connected to the second repair electrode.

In some embodiment, each of the sub-pixels further comprises a passivation layer, a protective electrode, and a planarization layer which are sequentially disposed between the source electrode and the anode electrode. The passivation layer is provided with a contact hole. The protective electrode is connected to the source electrode through the contact hole. The planarization layer is provided with a first via hole communicating with the contact hole. The anode electrode is connected to the protective electrode through the first via hole. The first repair electrode is disposed in a same layer as the protective electrode, and extends from an end of the protective electrode to a direction away from the drain electrode.

In some embodiment, the second repair electrode is disposed in a same layer as the anode electrode. Each of the sub-pixels further comprises a pixel definition layer. The pixel definition layer is disposed between the anode electrode and the cathode electrode and is provided with a connection hole. The cathode electrode is connected to the second repair electrode through the connection hole.

The present disclosure further provides a method for repairing the display panel according to any of the foregoing embodiments, which comprises:

detecting whether there is a bright spot sub-pixel in the sub-pixels; and if there is a bright spot sub-pixel, welding the first repair electrode, the second repair electrode, and the cathode electrode of the bright spot sub-pixel to connect the anode electrode and the cathode electrode of the bright spot sub-pixel.

The present disclosure provides a display panel comprising a plurality of sub-pixels. Each of the sub-pixels comprises:

a substrate;

an active layer disposed on a side of the substrate;

a source electrode and a drain electrode disposed on a side of the active layer away from the substrate;

an anode electrode disposed on a side of the source electrode away from the active layer and connected to the source electrode;

a first repair electrode disposed between the active layer and the anode electrode, located on a side of the source electrode away from the drain electrode, and connected to the source electrode;

a cathode electrode disposed on a side of the anode electrode away from the source electrode; and a second repair electrode disposed between the first repair electrode and the cathode electrode and connected to the cathode electrode, wherein an orthographic projection of the second repair electrode on the substrate at least partially overlaps with an orthographic projection of the first repair electrode on the substrate, and the second repair electrode is connected to the first repair electrode.

In some embodiment, the first repair electrode is disposed in a same layer as the source electrode, and extends from an end of the source electrode to a direction away from the drain electrode.

In some embodiment, the second repair electrode is disposed in a same layer as the anode electrode. Each of the sub-pixels further comprises a pixel definition layer. The pixel definition layer is disposed between the anode electrode and the cathode electrode and is provided with a connection hole. The cathode electrode is connected to the second repair electrode through the connection hole.

In some embodiment, each of the sub-pixels further comprises a planarization layer. The planarization layer is disposed between the source electrode and the anode electrode and is provided with a first via hole, and the anode electrode is connected to the source electrode through the first via hole. The connection hole exposes the second repair electrode, and the cathode electrode extends into the connection hole and is connected to the second repair electrode.

In some embodiment, each of the sub-pixels further comprises a passivation layer, a protective electrode, and a planarization layer which are sequentially disposed between the source electrode and the anode electrode. The passivation layer is provided with a contact hole, and the protective electrode is connected to the source electrode through the contact hole. The planarization layer is provided with a first via hole and a second via hole. The first via hole communicates with the contact hole. The anode electrode is connected to the protective electrode through the first via hole. The second via hole communicates with the connection hole. The second repair electrode extends into the second via hole. The cathode electrode extends from the connection hole into the second via hole and is connected to the second repair electrode.

In some embodiment, each of the sub-pixels further comprises an auxiliary repair electrode. The auxiliary repair electrode is disposed in a same layer as the protective electrode. The second via hole exposes the auxiliary repair electrode. The second repair electrode extends into the second via hole and is connected to the auxiliary repair electrode.

In some embodiment, the passivation layer is further provided with a repair hole, the repair hole is spaced from the contact hole and communicated with the second via hole and the connection hole, and the second repair electrode extends into the repair hole and is connected to the first repair electrode.

In some embodiment, each of the sub-pixels further comprises a passivation layer, a protective electrode, a planarization layer, and a pixel definition layer which are sequentially disposed between the source electrode and the anode electrode. The passivation layer is provided with a contact hole. The protective electrode is connected to the source electrode through the contact hole. The second repair electrode is disposed in a same layer as the protective electrode. The planarization layer is provided with a first via hole and a second via hole. The first via hole communicates with the contact hole. The anode electrode is connected to the protective electrode through the first via hole. The second via hole exposes the second repair electrode. The pixel definition layer is provided with a connection hole communicating with the second via hole. The connection hole exposes the second repair electrode. The cathode electrode extends into the connection hole and is connected to the second repair electrode.

In some embodiment, each of the sub-pixels further comprises a passivation layer, a protective electrode, and a planarization layer which are sequentially disposed between the source electrode and the anode electrode. The passivation layer is provided with a contact hole. The protective electrode is connected to the source electrode through the contact hole. The planarization layer is provided with a first via hole communicating with the contact hole. The anode electrode is connected to the protective electrode through the first via hole. The first repair electrode is disposed in a same layer as the protective electrode, and extends from an end of the protective electrode to a direction away from the drain electrode.

In some embodiment, the second repair electrode is disposed in a same layer as the anode electrode. Each of the sub-pixels further comprises a pixel definition layer. The pixel definition layer is disposed between the anode electrode and the cathode electrode and is provided with a connection hole. The cathode electrode is connected to the second repair electrode through the connection hole.

Compared with display panels in the prior art, in the display panel provided by the present disclosure, each of the sub-pixels is provided with the first repair electrode and the second repair electrode. When there is a bright spot sub-pixel in the display panel, the first repair electrode, the second repair electrode, and the cathode electrode in the bright spot sub-pixel are welded, so that the first repair electrode is connected to the anode electrode through the source electrode. That is, a potential of the first repair electrode is same as a potential of the anode electrode. Therefore, in the bright spot sub-pixel, a voltage applied on the cathode electrode will be sequentially transmitted to the anode electrode through the second repair electrode, the first repair electrode, and the source electrode, so that the potential of the anode electrode is same as a potential of the cathode electrode in the bright spot sub-pixel. That is, the anode electrode and cathode electrode in the bright spot sub-pixel are short-circuited. As a result, the bright spot sub-pixel is repaired into a dark spot sub-pixel, thereby repairing a bright spot in the display panel and greatly improving a quality of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
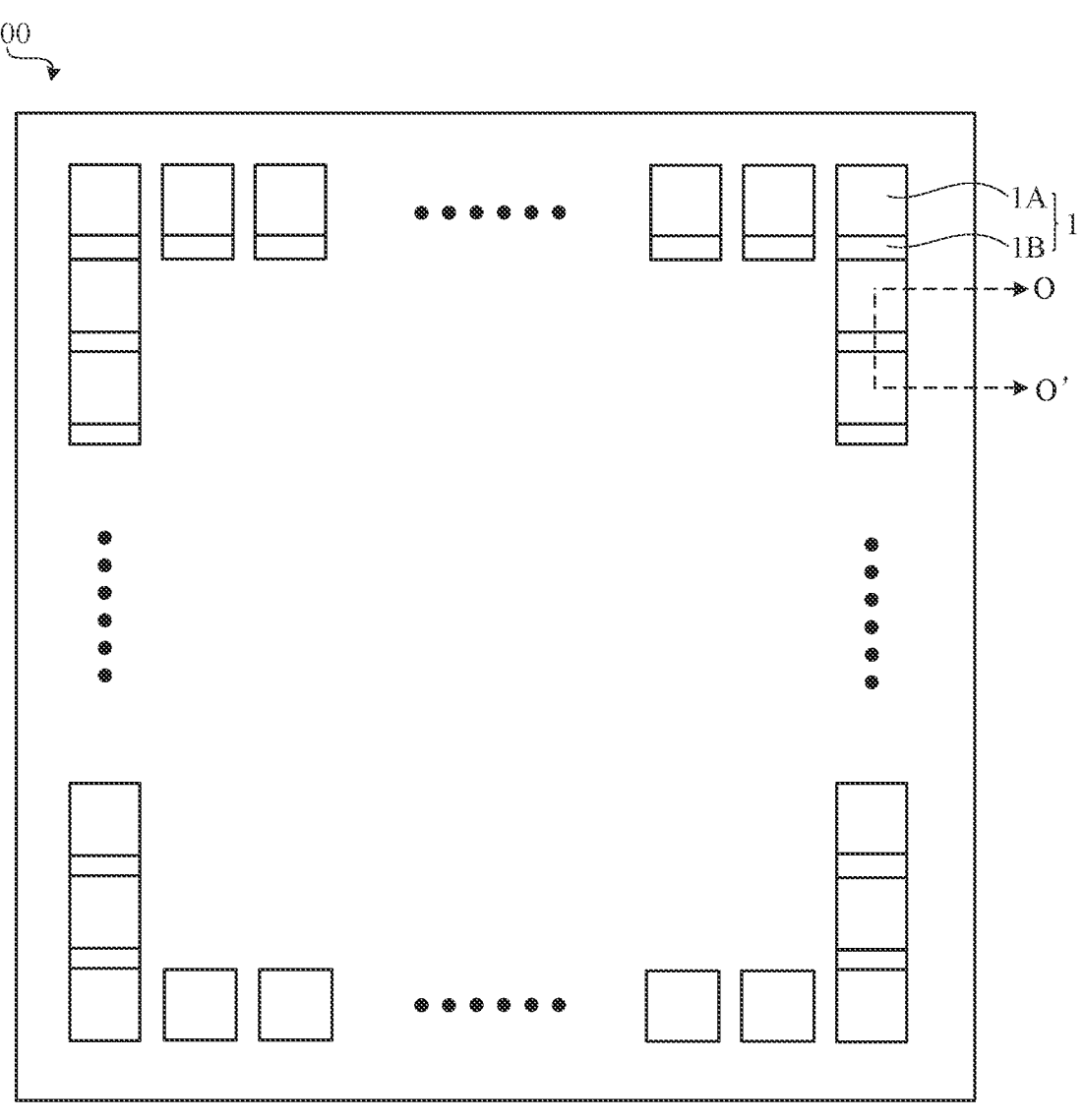
FIG. 1 is a schematic plan view of a display panel according to an embodiment of the present disclosure.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

The present disclosure provides a display panel and a method for repairing the same, which will be respectively described in detail below.

The present disclosure provides a display panel. The display panel comprises a plurality of sub-pixels. Each of the sub-pixels comprises a substrate, an active layer, a source electrode, a drain electrode, an anode electrode, a cathode electrode, a first repair electrode, and a second repair electrode. The active layer is disposed on a side of the substrate. The source electrode and the drain electrode are disposed on a side of the active layer away from the substrate. The anode electrode is disposed on a side of the source electrode away from the active layer and connected to the source electrode.

The first repair electrode is disposed between the active layer and the anode electrode and is located on a side of the source electrode away from the drain electrode. The first repair electrode is connected to the source electrode. The cathode electrode is disposed on a side of the anode electrode away from the source electrode. The second repair electrode is disposed between the first repair electrode and the cathode electrode and is connected to the cathode electrode. An orthographic projection of the second repair electrode on the substrate at least partially overlaps with an orthographic projection of the first repair electrode on the substrate. The second repair electrode is insulated from the first repair electrode.

Accordingly, in the display panel provided by the present disclosure, each of the sub-pixels is provided with the first repair electrode and the second repair electrode. When there is a bright spot sub-pixel in the display panel, the first repair electrode, the second repair electrode, and the cathode electrode in the bright spot sub-pixel are welded, so that the first repair electrode is connected to the anode electrode through the source electrode. That is, a potential of the first repair electrode is same as a potential of the anode electrode. Therefore, in the bright spot sub-pixel, a voltage applied on the cathode electrode will be sequentially transmitted to the anode electrode through the second repair electrode, the first repair electrode, and the source electrode, so that the potential of the anode electrode is same as a potential of the cathode electrode in the bright spot sub-pixel. That is, the anode electrode and cathode electrode in the bright spot sub-pixel are short-circuited. As a result, the bright spot sub-pixel is repaired into a dark spot sub-pixel, thereby repairing a bright spot in the display panel and greatly improving a quality of the display panel.

The display panel provided by the present disclosure will be described in detail below in conjunction with specific embodiments. It should be noted that a description order of the following embodiments is not intended to limit a preferred order of the embodiments.

It should be noted that in the display panel of the present disclosure, the source electrode and the drain electrode of one thin-film transistor are interchangeable. In the present disclosure, in order to distinguish two electrodes of one thin-film transistor except a gate electrode, one of the electrodes is called the source electrode, and the other electrode is called the drain electrode.

Figure 2:
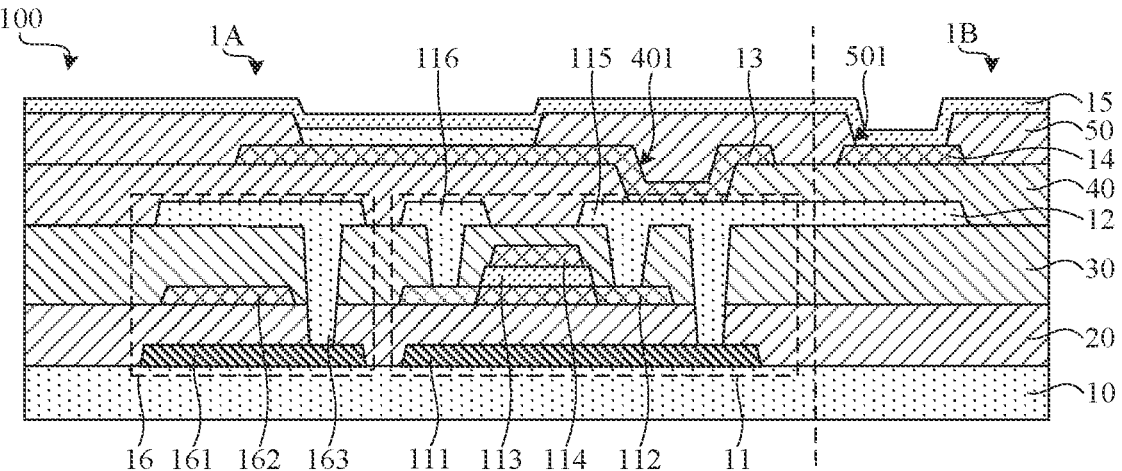
FIG. 2 is a first schematic structural diagram of the display panel shown in FIG. 1 along a section line O-O'.

Please refer to FIG. 1 and FIG. 2, a first embodiment of the present disclosure provides a display panel 100. The display panel 100 comprises a plurality of sub-pixels 1. Each of the sub-pixels 1 comprises a substrate 10, and a thin-film transistor 11, a first repair electrode 12, an anode electrode 13, a second repair electrode 14, and a cathode electrode 15 that are disposed on the substrate 10.

In this embodiment, each of the sub-pixels 1 has a light-emitting area 1A and a repair area 1B located on a side of the light-emitting area 1A. The repair area 1B refers to an area where a bright spot sub-pixel is repaired when the bright spot sub-pixel appears in the display panel 100.

Furthermore, in this embodiment, each of the sub-pixels 1 further comprises a buffer layer 20, an interlayer insulating layer 30, a planarization layer 40, and a pixel definition layer 50. The buffer layer 20, the interlayer insulating layer 30, the planarization layer 40, and the pixel definition layer 50 are all disposed in the light emitting area 1A and the repair area 1B.

Specifically, the thin-film transistor 11 is located in the light emitting area 1A. The thin-film transistor 11 comprises a light-shielding portion 111, an active layer 112, a gate insulating layer 113, a gate electrode 114, a source electrode 115, and a drain electrode 116.

The light-shielding portion 111 is disposed on the substrate 10. The light-shielding portion 111 may have a single-layer structure, a double-layer structure, or a multi-layer structure. Specifically, a material of the light-shielding portion 111 may comprise one or more of molybdenum, titanium, copper, and aluminum. Exemplarily, when the light-shielding portion 111 has a double-layer structure, the light-shielding portion 111 may comprise a bottom layer using titanium as a light-shielding material and a top layer using copper as a light-shielding material. Alternatively, the light-shielding portion 111 may comprise a bottom layer using molybdenum-titanium alloy as a light-shielding material, and a top layer using copper as a light-shielding material. The light-shielding portion 111 may have a thickness of 500 Å to 2000 Å, such as 500 Å, 800 Å, 1000 Å, 1200 Å, 1500 Å, 1800 Å, or 2000 Å.

The buffer layer 20 is disposed on a side of the light-shielding portion 111 away from the substrate 10. The buffer layer 20 may have a single-layer structure, a double-layer structure, or a multi-layer structure. Specifically, a material of the buffer layer 20 may comprise one or more of silicon nitride, silicon oxide, and silicon oxynitride. Exemplarily, when the buffer layer 20 has a double-layer structure, the buffer layer 20 may comprise a bottom layer using silicon oxide as a buffer material and a top layer using silicon nitride as a buffer material. The buffer layer 20 may have a thickness of 1000 Å to 5000 Å, such as 1000 Å, 1500 Å, 2000 Å, 2500 Å, 3000 Å, 3500 Å, 4000 Å, 4500 Å, or 5000 Å.

The active layer 112 is disposed on a side of the buffer layer 20 away from the light-shielding portion 111. An orthographic projection of the active layer 112 on the substrate 10 is located within an orthographic projection of the light-shielding portion 111 on the substrate 10. The active layer 112 comprises a channel (not shown), and a source contact portion (not shown) and a drain contact portion (not shown) that are located on opposite sides of the channel. A material of the active layer 112 may comprise one or more of IGZO, IGZTO, IGTO, IZTO, and IZO.

The gate insulating layer 113 is disposed on a side of the active layer 112 away from the buffer layer 20. In a direction from the source electrode 115 to the drain electrode 116, a width of the gate insulating layer 113 is slightly greater than a width of the channel. The gate insulating layer 113 may have a single-layer structure, a double-layer structure, or a multi-layer structure. Specifically, a material of the gate insulating layer 113 may comprise one or more of silicon nitride, silicon oxide, and silicon oxynitride. Exemplarily, when the gate insulating layer 113 has a double-layer structure, the gate insulating layer 113 may comprise a bottom layer using silicon oxide as an insulating material and a top layer using silicon nitride as an insulating material. The gate insulating layer 113 may have a thickness of 500 Å to 2000 Å, such as 500 Å, 800 Å, 1000 Å, 1200 Å, 1500 Å, 1800 Å, or 2000 Å.

The gate electrode 114 is disposed on a side of the gate insulating layer 113 away from the active layer 112. An orthographic projection of the gate electrode 114 on the substrate 10 overlaps with an orthographic projection of the channel on the substrate 10. The gate electrode 114 may have a single-layer structure, a double-layer structure, or a multi-layer structure. Specifically, a material of the gate electrode 114 may comprise one or more of molybdenum, titanium, copper, and aluminum. Alternatively, the material of the gate electrode 114 may comprise an alloy composed of at least two of the foregoing metals. Exemplarily, when the gate electrode 114 has a double-layer structure, the gate electrode 114 may comprise a bottom layer using molybdenum-titanium alloy as a conductive material and a top layer using copper as a conductive material. The gate electrode 114 may have a thickness of 2000 Å to 8000 Å, such as 2000 Å, 3000 Å, 4000 Å, 5000 Å, 6000 Å, 7000 Å, or 8000 Å.

The interlayer insulating layer 30 is disposed on a side of the gate electrode 114 away from the gate insulating layer 113. The interlayer insulating layer 30 may have a single-layer structure, a double-layer structure, or a multi-layer structure. Specifically, a material of the interlayer insulating layer 30 may comprise one or more of silicon nitride, silicon oxide, and silicon oxynitride. Exemplarily, when the interlayer insulating layer 30 has a double-layer structure, the interlayer insulating layer 30 may comprise a bottom layer using silicon oxide as an insulating material and a top layer using silicon nitride as an insulating material. The interlayer insulating layer 30 may have a thickness of 2000 Å to 10000 Å, such as 2000 Å, 3000 Å, 4000 Å, 5000 Å, 6000 Å, 7000 Å, 8000 Å, 9000 Å, or 10000 Å.

The source electrode 115 and the drain electrode 116 are disposed on a side of the interlayer insulating layer 30 away from the gate electrode 114. The source electrode 115 is connected to the source contact portion through a via hole (not shown). The drain electrode 116 is connected to the drain contact portion through another via hole (not shown). The source electrode 115 and the drain electrode 116 may have a single-layer structure, a double-layer structure, or a multi-layer structure. Specifically, a material of the source electrode 115 and a material of the drain electrode 116 are same, and may comprise one or more of molybdenum, titanium, copper, and aluminum, or may comprise an alloy composed of at least two of the foregoing metals. Exemplarily, when each of the source electrode 115 and the drain electrode 116 has a double-layer structure, each of the source electrode 115 and the drain electrode 116 may comprise a bottom layer using molybdenum-titanium alloy as a conductive material and a top layer using copper as a conductive material. The source electrode 115 and the drain electrode 116 have a same thickness of 2000 Å to 8000 Å, such as 2000 Å, 3000 Å, 4000 Å, 5000 Å, 6000 Å, 7000 Å, or 8000 Å.

In this embodiment, the first repair electrode 12 is disposed in a same layer as the source electrode 115 and is located on a side of the source electrode 115 away from the drain electrode 116. The first repair electrode 12 is connected to the source electrode 115. The first repair electrode 12 is located in the repair area 1B. Specifically, the first repair electrode 12 extends from an end of the source electrode 115 to a direction away from the drain electrode 116.

The planarization layer 40 is disposed on a side of the source electrode 115 away from the interlayer insulating layer 30. The planarization layer 40 is provided with a first via hole 401. The first via hole 401 exposes the source electrode 115. Specifically, a material of the planarization layer 40 may be an inorganic material. The inorganic material may comprise one or more of silicon nitride, silicon oxide, and silicon oxynitride. Alternatively, the material of the planarization layer 40 may be an organic material. The organic material may comprise organic resins, such as epoxy resins, acrylic resins, and the like. The planarization layer 40 may have a thickness of 1000 Å to 5000 Å, such as 1000 Å, 1500 Å, 2000 Å, 2500 Å, 3000 Å, 3500 Å, 4000 Å, 4500 Å, or 5000 Å.

The anode electrode 13 is disposed on a side of the planarization layer 40 away from the source electrode 115. The anode electrode 13 is located in the light emitting area 1A. The anode electrode 13 extends into the first via hole 401 and is connected to the source electrode 115. The anode electrode 13 may have a single-layer structure, a double-layer structure, or a triple-layer structure. A material of the anode electrode 13 may comprise one or more of ITO, IZO, Ag, Pd, Cu, Al, Ni, and La. Exemplarily, the anode electrode 13 may have a three-layer structure of ITO/Ag/ITO.

The second repair electrode 14 and the anode electrode 13 are disposed in a same layer and spaced apart. The second repair electrode 14 is located in the repair area 1B. An orthographic projection of the second repair electrode 14 on the substrate 10 at least partially overlaps with an ortho-graphic projection of the first repair electrode 12 on the substrate 10. The second repair electrode 14 is insulated from the first repair electrode 12. Specifically, the planar-ization layer 40 is disposed between the second repair electrode 14 and the first repair electrode 12.

Because the second repair electrode 14 and the anode electrode 13 of this embodiment may be fabricated through a same mask, disposing the second repair electrode 14 does not increase process cost.

The pixel definition layer 50 is disposed on a side of the anode electrode 13 away from the planarization layer 40. The pixel definition layer 50 is provided with a connection hole 501. The connection hole 501 exposes the second repair electrode 14. It should be noted that the pixel definition layer 50 is further provided with a via hole (not shown) exposing the anode electrode 13, and the related art is the prior art, which will not be described in detail herein.

The cathode electrode 15 is disposed on a side of the pixel definition layer 50 away from the anode electrode 13. The cathode electrode 15 extends from the light emitting area 1A to the repair area 1B. The cathode electrode 15 is connected to the second repair electrode 14 through the connection hole 501. Specifically, the cathode electrode 15 extends into the connection hole 501 and is connected to the second repair electrode 14.

In this embodiment, when there is a bright spot sub-pixel in the display panel 100, in the repair area 1B of the bright spot sub-pixel, the first repair electrode 12, the second repair electrode 14, and the cathode electrode of the bright spot sub-pixel may be welded by a laser, so that the first repair electrode 12 is connected to the anode electrode 13 through the source electrode 115. That is, a potential of the first repair electrode 12 is same as a potential of the anode electrode 13. Therefore, in the welded display panel 100, a voltage applied on the cathode electrode 15 of the bright spot sub-pixel will be sequentially transmitted to the anode electrode 13 through the second repair electrode 14, the first repair electrode 12, and the source electrode 115, so that the potential of the anode electrode 13 is same as a potential of the cathode electrode 15 in the bright spot sub-pixel. That is, the anode electrode 13 and cathode electrode 15 in the bright spot sub-pixel are short-circuited. As a result, the bright spot sub-pixel is repaired into a dark spot sub-pixel, thereby repairing a bright spot in the display panel 100 and greatly improving a quality of the display panel 100.

Furthermore, in this embodiment, each of the sub-pixels 1 further comprises a storage capacitor 16. The storage capacitor 16 is disposed in the light emitting area 1A, and is located on a side of the thin-film transistor 11 away from the repair area 1B. The storage capacitor 16 comprises a first electrode 161, a second electrode 162, and a third electrode 163. Orthographic projections of the first electrode 161, the second electrode 162, and the third electrode 163 on the substrate 10 at least partially overlap with each other. The first electrode 161 is disposed in a same layer as the light-shielding portion 111. The second electrode 162 is disposed in a same layer as the active layer 112 and is insulated from the first electrode 161. The third electrode 163 is disposed in a same layer as the drain electrode 116 and is located on a side of the drain electrode 116 away from the source electrode 115. The third electrode 163 is connected to the first electrode 161 through a via hole (not shown) in the interlayer insulating layer 30 and a via hole (not shown) in the buffer layer 20.

It should be noted that a structure of the storage capacitor 16 in this embodiment is only an example, which is used to facilitate a description of this embodiment. The specific structure of the storage capacitor 16 may be configured according to actual application requirements. This embodi-ment should not be construed as a limitation on the present disclosure.

Furthermore, in this embodiment, a light-emitting layer (not shown) is further disposed between the anode electrode 13 and the pixel definition layer 50. For a specific structure of the light-emitting layer, reference may be made to the prior art, which will not be described in detail herein.

Figure 3:
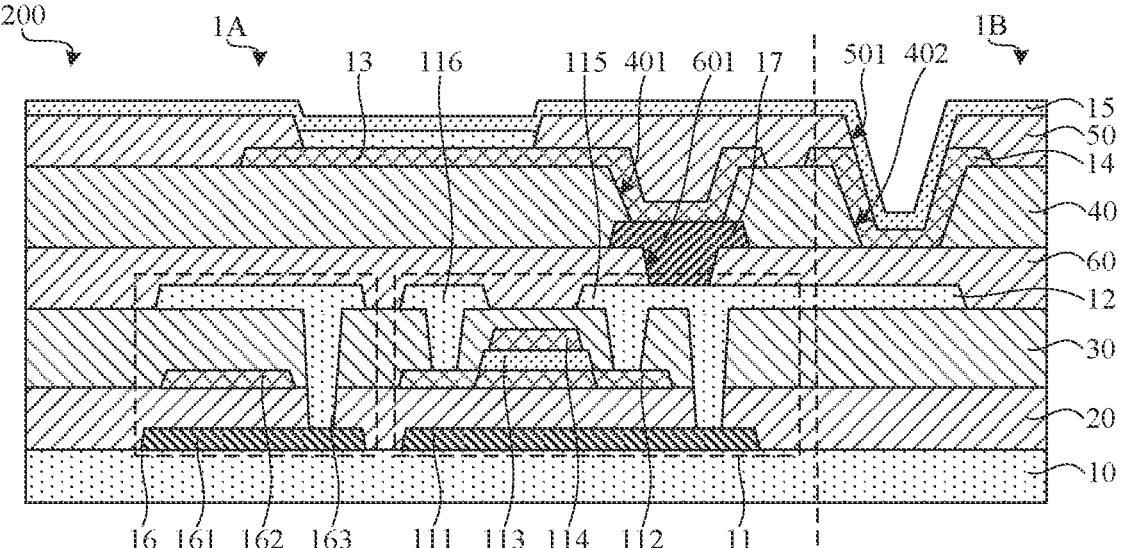
FIG. 3 is a second schematic structural diagram of the display panel shown in FIG. 1 along the section line O-O'.

Please refer to FIG. 3, a second embodiment of the present disclosure provides a display panel 200. The display panel 200 provided by the second embodiment of the present disclosure differs from the first embodiment in that each sub-pixel 1 further comprises a passivation layer 60 and a protective electrode 17. The passivation layer 60 is disposed on a side of the source electrode 115 away from the interlayer insulating layer 30. The protective electrode 17 is disposed between the passivation layer 60 and the planar-ization layer 40. The passivation layer 60 is provided with a contact hole 601 communicating with the first via hole 401. The protective electrode 17 is connected to the source electrode 115 through the contact hole 601. The anode electrode 13 is connected to the protective electrode 17 through the first via hole 401. The planarization layer 40 is further provided with a second via hole 402 spaced apart from the first via hole 401. The second via hole 402 communicates with the connection hole 501 and exposes the passivation layer 60. The second repair electrode 14 extends into the second via hole 402. The cathode electrode 15 extends from the connection hole 501 into the second via hole 402 and is connected to the second repair electrode 14.

The contact hole 601 exposes the source electrode 115. The protective electrode 17 extends into the contact hole 601 and is connected to the source electrode 115. The first via hole 401 exposes the protective electrode 17. The anode electrode 13 extends into the first via hole 401 and is connected to the protective electrode 17.

In this embodiment, the protective electrode 17 is dis-posed on a surface of the source electrode 115 in contact with the anode electrode 13. The protective electrode 17 protects the source electrode 115 to prevent a metal material of the source electrode 115 from being oxidized, thereby improving a signal transmission stability of the source electrode 115 and improving a driving performance of the thin-film transistor 11.

In this embodiment, when there is a bright spot sub-pixel in the display panel 200, in the repair area 1B of the bright spot sub-pixel, the first repair electrode 12, the second repair electrode 14, and the cathode electrode of the bright spot sub-pixel may be welded by a laser, so that the first repair electrode 12 is connected to the anode electrode 13 through the source electrode 115 and the protective electrode 17 in sequence. That is, a potential of the first repair electrode 12 is same as a potential of the anode electrode 13. Therefore, in the welded display panel 200, a voltage applied on the cathode electrode 15 of the bright spot sub-pixel will be sequentially transmitted to the anode electrode 13 through the second repair electrode 14, the first repair electrode 12, the source electrode 115, and the protective electrode 17, so that the potential of the anode electrode 13 is same as a potential of the cathode electrode 15 in the bright spot sub-pixel. That is, the anode electrode 13 and cathode electrode 15 in the bright spot sub-pixel are short-circuited. As a result, the bright spot sub-pixel is repaired into a dark spot sub-pixel, thereby repairing a bright spot in the display panel 200 and greatly improving a quality of the display panel 200.

Figure 4:
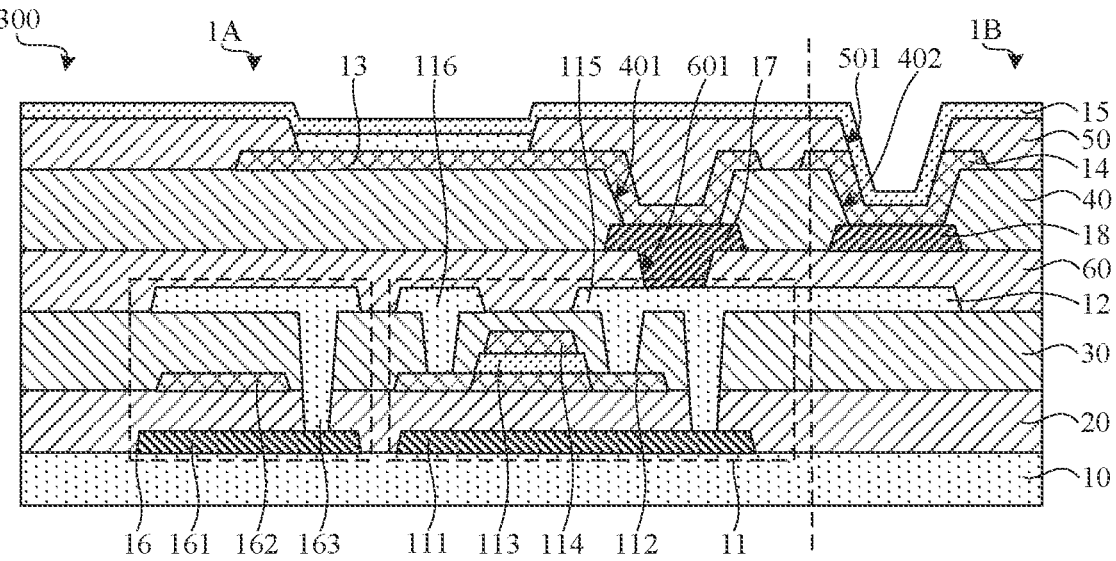
FIG. 4 is a third schematic structural diagram of the display panel shown in FIG. 1 along the section line O-O'.

Please refer to FIG. 4, a third embodiment of the present disclosure provides a display panel 300. The display panel 300 provided by the third embodiment of the present disclosure differs from the second embodiment in that each sub-pixel 1 further comprises an auxiliary repair electrode 18. The auxiliary repair electrode 18 is disposed in a same layer as the protective electrode 17. The second via hole 402 exposes the auxiliary repair electrode 18. The second repair electrode 14 extends into the second via hole 402 and is connected to the auxiliary repair electrode 18.

The auxiliary repair electrode 18 is a conductive electrode and is connected to the cathode electrode 15. In this embodiment, the auxiliary repair electrode 18 is disposed under the second repair electrode 14 to increase a thickness of conductive layers in the repair area 1B, which increases a success rate of welding the cathode electrode 15 and the first repair electrode 12 during a process of repairing a bright spot of the display panel 300, thereby improving a success rate of repairing the bright spot of the display panel 300.

Because the auxiliary repair electrode 18 and the protective electrode 17 are disposed in the same layer, that is, they may be fabricated through a same mask, disposing the auxiliary repair electrode 18 of this embodiment does not increase the process cost.

Figure 5:
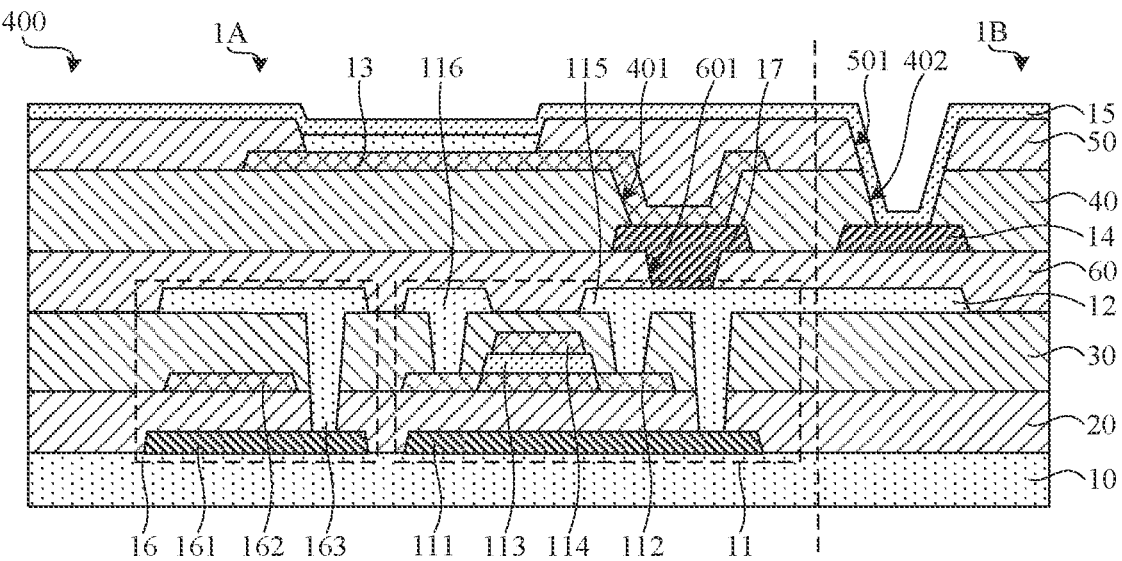
FIG. 5 is a fourth schematic structural diagram of the display panel shown in FIG. 1 along the section line O-O'.

Please refer to FIG. 5, a fourth embodiment of the present disclosure provides a display panel 400. The display panel 400 provided by the fourth embodiment of the present disclosure differs from the first embodiment in that each sub-pixel 1 further comprises a passivation layer 60 and a protective electrode 17. The passivation layer 60 is disposed on a side of the source electrode 115 away from the interlayer insulating layer 30. The protective electrode 17 is disposed between the passivation layer 60 and the planarization layer 40. The passivation layer 60 is provided with a contact hole 601 communicating with the first via hole 401. The protective electrode 17 is connected to the source electrode 115 through the contact hole 601. The anode electrode 13 is connected to the protective electrode 17 through the first via hole 401. The second repair electrode 14 and the protective electrode 17 are disposed in a same layer and spaced apart. The planarization layer 40 is further provided with a second via hole 402 spaced apart from the first via hole 401. The second via hole 402 communicates with the connection hole 501 and exposes the second repair electrode 14. The cathode electrode 15 extends from the connection hole 501 into the second via hole 402 and is connected to the second repair electrode 14.

The contact hole 601 exposes the source electrode 115. The protective electrode 17 extends into the contact hole 601 and is connected to the source electrode 115. The first via hole 401 exposes the protective electrode 17. The anode electrode 13 extends into the first via hole 401 and is connected to the protective electrode 17.

In this embodiment, the protective electrode 17 is disposed on a surface of the source electrode 115 in contact with the anode electrode 13. The protective electrode 17 protects the source electrode 115 to prevent a metal material of the source electrode 115 from being oxidized, thereby improving a signal transmission stability of the source electrode 115 and improving a driving performance of the thin-film transistor 11. Furthermore, because the second repair electrode 14 and the protective electrode 17 of this embodiment may be fabricated through a same mask, disposing the second repair electrode 14 does not increase the process cost.

In this embodiment, when there is a bright spot sub-pixel in the display panel 400, in the repair area 1B of the bright spot sub-pixel, the first repair electrode 12, the second repair electrode 14, and the cathode electrode of the bright spot sub-pixel may be welded by a laser, so that the first repair electrode 12 is connected to the anode electrode 13 through the source electrode 115 and the protective electrode 17 in sequence. That is, a potential of the first repair electrode 12 is same as a potential of the anode electrode 13. Therefore, in the welded display panel 400, a voltage applied on the cathode electrode 15 of the bright spot sub-pixel will be sequentially transmitted to the anode electrode 13 through the second repair electrode 14, the first repair electrode 12, the source electrode 115, and the protective electrode 17, so that the potential of the anode electrode 13 is same as a potential of the cathode electrode 15 in the bright spot sub-pixel. That is, the anode electrode 13 and cathode electrode 15 in the bright spot sub-pixel are short-circuited. As a result, the bright spot sub-pixel is repaired into a dark spot sub-pixel, thereby repairing a bright spot in the display panel 400 and greatly improving a quality of the display panel 400.

Figure 6:
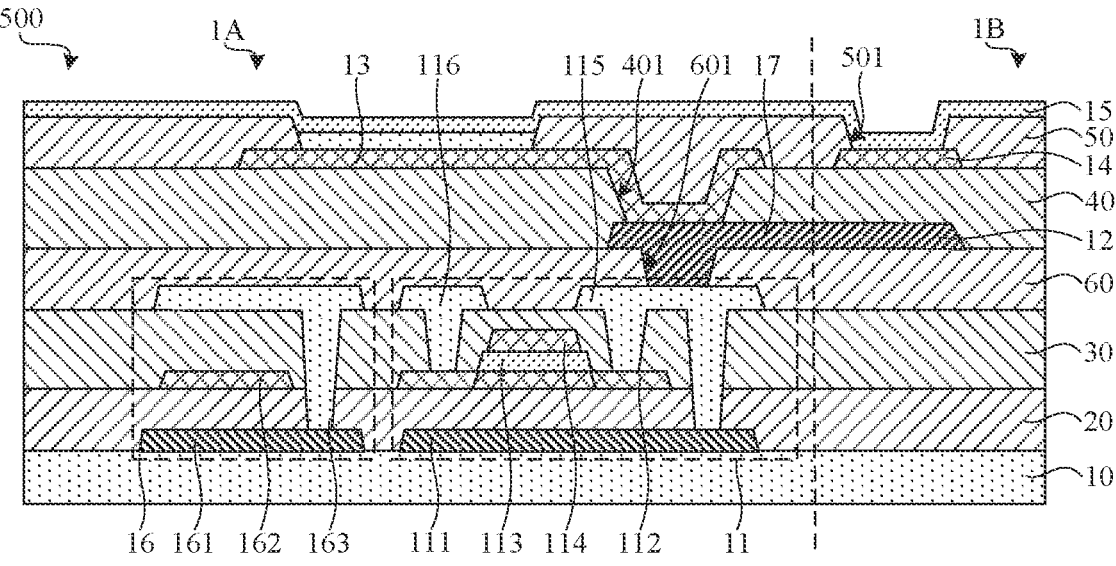
FIG. 6 is a fifth schematic structural diagram of the display panel shown in FIG. 1 along the section line O-O'.

Please refer to FIG. 6, a fifth embodiment of the present disclosure provides a display panel 500. The display panel 500 provided by the fifth embodiment of the present disclosure differs from the first embodiment in that each sub-pixel 1 further comprises a passivation layer 60 and a protective electrode 17. The passivation layer 60 is disposed on a side of the source electrode 115 away from the interlayer insulating layer 30. The protective electrode 17 is disposed between the passivation layer 60 and the planarization layer 40. The passivation layer 60 is provided with a contact hole 601 communicating with the first via hole 401. The protective electrode 17 is connected to the source electrode 115 through the contact hole 601. The anode electrode 13 is connected to the protective electrode 17 through the first via hole 401. The first repair electrode 12 is disposed in a same layer as the protective electrode 17, and extends from an end of the protective electrode 17 to a direction away from the drain electrode 116.

The contact hole 601 exposes the source electrode 115. The protective electrode 17 extends into the contact hole 601 and is connected to the source electrode 115. The first via hole 401 exposes the protective electrode 17. The anode electrode 13 extends into the first via hole 401 and is connected to the protective electrode 17.

In this embodiment, the protective electrode 17 is disposed on a surface of the source electrode 115 in contact with the anode electrode 13. The protective electrode 17 protects the source electrode 115 to prevent a metal material of the source electrode 115 from being oxidized, thereby improving a signal transmission stability of the source electrode 115 and improving a driving performance of the thin-film transistor 11.

In this embodiment, when there is a bright spot sub-pixel in the display panel 500, in the repair area 1B of the bright spot sub-pixel, the first repair electrode 12, the second repair electrode 14, and the cathode electrode of the bright spot sub-pixel may be welded by a laser, so that the first repair electrode 12 is connected to the anode electrode 13 through the protective electrode 17. That is, a potential of the first repair electrode 12 is same as a potential of the anode electrode 13. Therefore, in the welded display panel 500, a voltage applied on the cathode electrode 15 of the bright spot sub-pixel will be sequentially transmitted to the anode electrode 13 through the second repair electrode 14, the first repair electrode 12, and the protective electrode 17, so that the potential of the anode electrode 13 is same as a potential of the cathode electrode 15 in the bright spot sub-pixel. That is, the anode electrode 13 and cathode electrode 15 in the bright spot sub-pixel are short-circuited. As a result, the bright spot sub-pixel is repaired into a dark spot sub-pixel, thereby repairing a bright spot in the display panel 500 and greatly improving a quality of the display panel 500.

Figure 7:
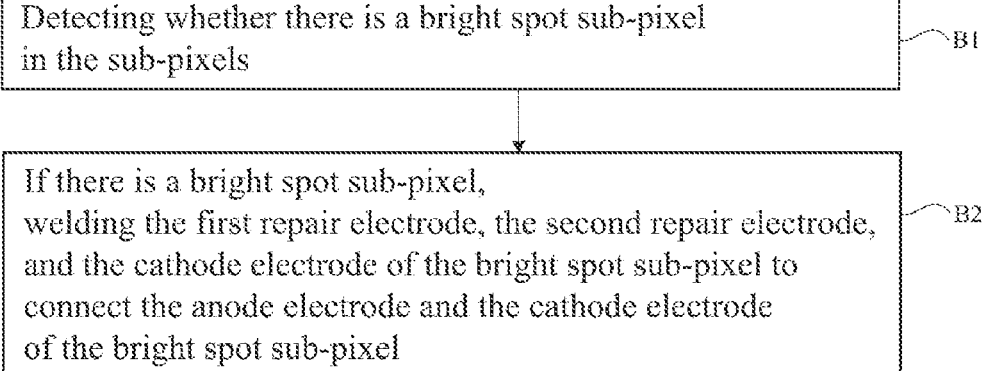
FIG. 7 is a schematic flowchart of a method for repairing the display panel according to an embodiment of the present disclosure.

Please refer to FIG. 7, the present disclosure further provides a method for repairing a display panel. The display panel may be the display panel described in any of the foregoing embodiments. The method for repairing the display panel comprises the following steps.

B1: detecting whether there is a bright spot sub-pixel in the sub-pixels.

B2: if there is a bright spot sub-pixel, welding the first repair electrode, the second repair electrode, and the cathode electrode of the bright spot sub-pixel to connect the anode electrode and the cathode electrode of the bright spot sub-pixel.

Specifically, taking the display panel 300 described in the third embodiment as an example, in conjunction with FIG. 4 and FIG. 7, a method for repairing the display panel 300 comprises the following steps.

B1: detecting whether there is a bright spot sub-pixel in the sub-pixels 1.

Specifically, in a lighting test of the display panel 300, it is detected whether there is a bright spot sub-pixel in the display panel 300.

B2: if there is a bright spot sub-pixel, welding the first repair electrode 12, the second repair electrode 14, and the cathode electrode 15 of the bright spot sub-pixel to connect the anode electrode 13 and the cathode electrode 15 of the bright spot sub-pixel.

Specifically, the repair area 1B of the bright spot sub-pixel is irradiated with a laser, so that the first repair electrode 12, the second repair electrode 14, the auxiliary repair electrode 18, and the cathode electrode 15 located in the repair area 1B are welded together. At this time, in the bright spot sub-pixel, a voltage is applied to the cathode electrode 15, and the voltage applied to the cathode electrode 15 is transmitted to the anode electrode 13 through the second repair electrode 14, the auxiliary repair electrode 18, the first repair electrode 12, the source electrode 115, and the protective electrode 17 in sequence, so that a potential of the anode electrode 13 and a potential of the cathode electrode 15 in the bright spot sub-pixel are same. That is, the anode electrode 13 and cathode electrode 15 in the bright spot sub-pixel are short-circuited. Therefore, the bright spot sub-pixel is repaired into a dark spot sub-pixel, In this embodiment, after step B2, the method for repairing the display panel 300 may further comprise: cutting off a connection between the drain electrode 116 in the bright spot sub-pixel and a power supply signal line.

It should be noted that methods for repairing the display panels of the other aforementioned embodiments, that is, methods for repairing bright spot sub-pixels in the display panels may refer to the description of this embodiment, which will not be described in detail herein.

Furthermore, the present disclosure provides a display panel. The display panel comprises a plurality of sub-pixels. Each of the sub-pixels comprises a substrate, an active layer, a source electrode, a drain electrode, an anode electrode, a cathode electrode, a first repair electrode, and a second repair electrode. The active layer is disposed on a side of the substrate. The source electrode and the drain electrode are disposed on a side of the active layer away from the substrate. The anode electrode is disposed on a side of the source electrode away from the active layer and connected to the source electrode. The first repair electrode is disposed between the active layer and the anode electrode and is located on a side of the source electrode away from the drain electrode. The first repair electrode is connected to the source electrode. The cathode electrode is disposed on a side of the anode electrode away from the source electrode. The second repair electrode is disposed between the first repair electrode and the cathode electrode and is connected to the cathode electrode. An orthographic projection of the second repair electrode on the substrate at least partially overlaps with an orthographic projection of the first repair electrode on the substrate. The second repair electrode is connected to the first repair electrode.

It should be noted that a structure of the aforementioned display panel is a structure after repairing a bright spot sub-pixel appearing in the display panel. The structure of the repaired display panel provided by the present disclosure will be described in detail below by taking a structure of the display panel of the third embodiment after repairing a bright spot sub-pixel as an example.

Figure 8:
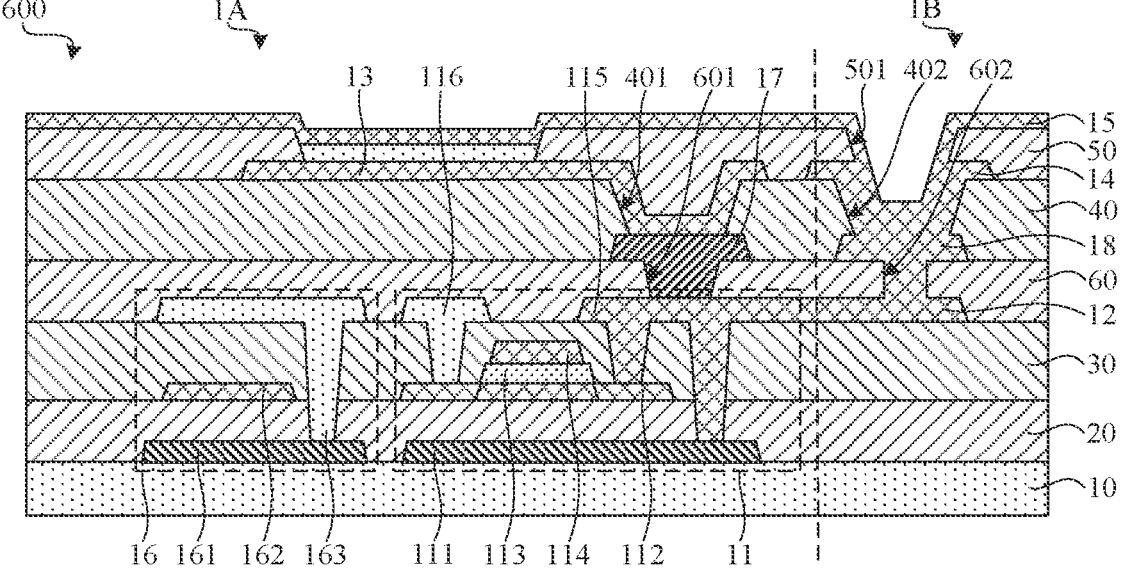
FIG. 8 is a schematic structural diagram of the repaired display panel according to an embodiment of the present disclosure.

Please refer to FIG. 8, a sixth embodiment of the present disclosure provides a display panel 600. The display panel 600 provided by the sixth embodiment of the present disclosure differs from the third embodiment in that the passivation layer 60 is provided with a repair hole 602. The repair hole 602 is located in repair area 1B. The repair hole 602 communicates with the second via hole 402 and the connection hole 501. The second repair electrode 14 extends into the repair hole 602 and is connected to the first repair electrode 12.

It should be noted that for structures of the display panels of the other aforementioned embodiments after repairing bright spot sub-pixels in the display panels may refer to this embodiment, which will not be described in detail herein.

The present disclosure further provides a display device. The display device may be a display product such as a mobile phone, a tablet computer, a notebook computer, or a television. The display device comprises a casing and a display panel disposed in the casing. The display panel may be the display panel described in any of the foregoing embodiments. For a specific structure of the display panel, reference may be made to descriptions of the foregoing embodiments, which will not be described in detail herein.

The display panel and the method for repairing the same provided by the embodiments of the present disclosure are described in detail above. The present disclosure uses specific examples to describe principles and embodiments of the present invention. The above description of the embodiments is only for helping to understand the solutions of the present disclosure and its core ideas. Furthermore, those skilled in the art may make modifications to the specific embodiments and applications according to ideas of the present invention. In conclusion, the present specification should not be construed as a limitation to the present invention.

What is claimed is:

1. A display panel, comprising a plurality of sub-pixels, wherein each of the sub-pixels comprises:

a substrate;

an active layer disposed on a side of the substrate;

a source electrode and a drain electrode disposed on a side of the active layer away from the substrate;

an anode electrode disposed on a side of the source electrode away from the active layer and connected to the source electrode;

a first repair electrode disposed between the active layer and the anode electrode, located on a side of the source electrode away from the drain electrode, and connected to the source electrode;

a cathode electrode disposed on a side of the anode electrode away from the source electrode; and a second repair electrode disposed between the first repair electrode and the cathode electrode and in direct contact with a surface of the cathode electrode facing the anode electrode, wherein an orthographic projection of the second repair electrode on the substrate at least partially overlaps with an orthographic projection of the first repair electrode on the substrate, and the second repair electrode is insulated from the first repair electrode.

2. The display panel according to claim 1, wherein the first repair electrode is disposed in a same layer as the source electrode, and extends from an end of the source electrode to a direction away from the drain electrode.

3. The display panel according to claim 2, wherein the second repair electrode is disposed in a same layer as the anode electrode; and each of the sub-pixels further comprises a pixel definition layer, the pixel definition layer is disposed between the anode electrode and the cathode electrode and is provided with a connection hole, and the cathode electrode is connected to the second repair electrode through the connection hole.

4. The display panel according to claim 3, wherein each of the sub-pixels further comprises a planarization layer, the planarization layer is disposed between the source electrode and the anode electrode and is provided with a first via hole, and the anode electrode is connected to the source electrode through the first via hole; and the connection hole exposes the second repair electrode, and the cathode electrode extends into the connection hole and is connected to the second repair electrode.

5. The display panel according to claim 3, wherein each of the sub-pixels further comprises a passivation layer, a protective electrode, and a planarization layer which are sequentially disposed between the source electrode and the anode electrode;

the passivation layer is provided with a contact hole, and the protective electrode is connected to the source electrode through the contact hole; and the planarization layer is provided with a first via hole and a second via hole, the first via hole communicates with the contact hole, the anode electrode is connected to the protective electrode through the first via hole, the second via hole communicates with the connection hole, the second repair electrode extends into the second via hole, and the cathode electrode extends from the connection hole into the second via hole and is connected to the second repair electrode.

6. The display panel according to claim 5, wherein each of the sub-pixels further comprises an auxiliary repair electrode, the auxiliary repair electrode is disposed in a same layer as the protective electrode, the second via hole exposes the auxiliary repair electrode, and the second repair electrode extends into the second via hole and is connected to the auxiliary repair electrode.

7. The display panel according to claim 2, wherein each of the sub-pixels further comprises a passivation layer, a protective electrode, a planarization layer, and a pixel definition layer which are sequentially disposed between the source electrode and the anode electrode;

the passivation layer is provided with a contact hole, the protective electrode is connected to the source electrode through the contact hole, and the second repair electrode is disposed in a same layer as the protective electrode;

the planarization layer is provided with a first via hole and a second via hole, the first via hole communicates with the contact hole, the anode electrode is connected to the protective electrode through the first via hole, and the second via hole exposes the second repair electrode; and the pixel definition layer is provided with a connection hole communicating with the second via hole, the connection hole exposes the second repair electrode, and the cathode electrode extends into the connection hole and is connected to the second repair electrode.

8. The display panel according to claim 1, wherein each of the sub-pixels further comprises a passivation layer, a protective electrode, and a planarization layer which are sequentially disposed between the source electrode and the anode electrode;

the passivation layer is provided with a contact hole, and the protective electrode is connected to the source electrode through the contact hole;

the planarization layer is provided with a first via hole communicating with the contact hole, and the anode electrode is connected to the protective electrode through the first via hole; and the first repair electrode is disposed in a same layer as the protective electrode, and extends from an end of the protective electrode to a direction away from the drain electrode.

9. The display panel according to claim 8, wherein the second repair electrode is disposed in a same layer as the anode electrode; and each of the sub-pixels further comprises a pixel definition layer, the pixel definition layer is disposed between the anode electrode and the cathode electrode and is provided with a connection hole, and the cathode electrode is connected to the second repair electrode through the connection hole.

10. A display panel, comprising a plurality of sub-pixels, wherein each of the sub-pixels comprises:

a substrate;

an active layer disposed on a side of the substrate;

a source electrode and a drain electrode disposed on a side of the active layer away from the substrate;

an anode electrode disposed on a side of the source electrode away from the active layer and connected to the source electrode;

a first repair electrode disposed between the active layer and the anode electrode, located on a side of the source electrode away from the drain electrode, and connected to the source electrode;

a cathode electrode disposed on a side of the anode electrode away from the source electrode; and a second repair electrode disposed between the first repair electrode and the cathode electrode and in direct contact with a surface of the cathode electrode facing the anode electrode, wherein an orthographic projection of the second repair electrode on the substrate at least partially overlaps with an orthographic projection of the first repair electrode on the substrate, and the second repair electrode is connected to the first repair electrode.

11. The display panel according to claim 10, wherein the first repair electrode is disposed in a same layer as the source electrode, and extends from an end of the source electrode to a direction away from the drain electrode.

12. The display panel according to claim 11, wherein the second repair electrode is disposed in a same layer as the anode electrode; and each of the sub-pixels further comprises a pixel definition layer, the pixel definition layer is disposed between the anode electrode and the cathode electrode and is provided with a connection hole, and the cathode electrode is connected to the second repair electrode through the connection hole.

13. The display panel according to claim 12, wherein each of the sub-pixels further comprises a planarization layer, the planarization layer is disposed between the source electrode and the anode electrode and is provided with a first via hole, and the anode electrode is connected to the source electrode through the first via hole; and the connection hole exposes the second repair electrode, and the cathode electrode extends into the connection hole and is connected to the second repair electrode.

14. The display panel according to claim 12, wherein each of the sub-pixels further comprises a passivation layer, a protective electrode, and a planarization layer which are sequentially disposed between the source electrode and the anode electrode;

the passivation layer is provided with a contact hole, and the protective electrode is connected to the source electrode through the contact hole; and the planarization layer is provided with a first via hole and a second via hole, the first via hole communicates with the contact hole, the anode electrode is connected to the protective electrode through the first via hole, the second via hole communicates with the connection hole, the second repair electrode extends into the second via hole, and the cathode electrode extends from the connection hole into the second via hole and is connected to the second repair electrode.

15. The display panel according to claim 14, wherein each of the sub-pixels further comprises an auxiliary repair electrode, the auxiliary repair electrode is disposed in a same layer as the protective electrode, the second via hole exposes the auxiliary repair electrode, and the second repair electrode extends into the second via hole and is connected to the auxiliary repair electrode.

16. The display panel according to claim 15, wherein the passivation layer is further provided with a repair hole, the repair hole is spaced from the contact hole and communicated with the second via hole and the connection hole, and the second repair electrode extends into the repair hole and is connected to the first repair electrode.

17. The display panel according to claim 11, wherein each of the sub-pixels further comprises a passivation layer, a protective electrode, a planarization layer, and a pixel definition layer which are sequentially disposed between the source electrode and the anode electrode;

the passivation layer is provided with a contact hole, the protective electrode is connected to the source electrode through the contact hole, and the second repair electrode is disposed in a same layer as the protective electrode;

the planarization layer is provided with a first via hole and a second via hole, the first via hole communicates with the contact hole, the anode electrode is connected to the protective electrode through the first via hole, and the second via hole exposes the second repair electrode; and the pixel definition layer is provided with a connection hole communicating with the second via hole, the connection hole exposes the second repair electrode, and the cathode electrode extends into the connection hole and is connected to the second repair electrode.

18. The display panel according to claim 10, wherein each of the sub-pixels further comprises a passivation layer, a protective electrode, and a planarization layer which are sequentially disposed between the source electrode and the anode electrode;

the passivation layer is provided with a contact hole, and the protective electrode is connected to the source electrode through the contact hole;

the planarization layer is provided with a first via hole communicating with the contact hole, and the anode electrode is connected to the protective electrode through the first via hole; and the first repair electrode is disposed in a same layer as the protective electrode, and extends from an end of the protective electrode to a direction away from the drain electrode.

19. The display panel according to claim 18, wherein the second repair electrode is disposed in a same layer as the anode electrode; and each of the sub-pixels further comprises a pixel definition layer, the pixel definition layer is disposed between the anode electrode and the cathode electrode and is provided with a connection hole, and the cathode electrode is connected to the second repair electrode through the connection hole.

* * * * *